United States Patent
Ozaki et al.

(10) Patent No.: US 8,461,041 B2
(45) Date of Patent: Jun. 11, 2013

(54) SEMICONDUCTOR DEVICE AND METHOD OF MANUFACTURING SEMICONDUCTOR DEVICE

(75) Inventors: Shirou Ozaki, Kawasaki (JP); Yoshihiro Nakata, Kawasaki (JP); Yasushi Kobayashi, Kawasaki (JP); Yuichi Minoura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 47 days.

(21) Appl. No.: 12/955,525

(22) Filed: Nov. 29, 2010

(65) Prior Publication Data

US 2011/0068471 A1    Mar. 24, 2011

Related U.S. Application Data

(63) Continuation of application No. PCT/JP2008/061023, filed on Jun. 17, 2008.

(51) Int. Cl.
*H01L 21/4763* (2006.01)

(52) U.S. Cl.
USPC ........................................................ 438/627

(58) Field of Classification Search
USPC .................. 438/687, 778, 627, 639
See application file for complete search history.

(56) References Cited

U.S. PATENT DOCUMENTS

| | | | |
|---|---|---|---|
| 6,582,777 B1 | 6/2003 | Ross et al. | |
| 2003/0089992 A1* | 5/2003 | Rathi et al. | 257/762 |
| 2003/0134039 A1 | 7/2003 | Ross et al. | |
| 2003/0143843 A1 | 7/2003 | Ryu | |
| 2005/0184397 A1 | 8/2005 | Gates et al. | |
| 2006/0199376 A1 | 9/2006 | Deguchi | |
| 2008/0136037 A1* | 6/2008 | Arakawa | 257/773 |
| 2009/0045412 A1 | 2/2009 | Udagawa | |

FOREIGN PATENT DOCUMENTS

| | | |
|---|---|---|
| CN | 1596466 A | 3/2005 |
| CN | 101051621 A | 10/2007 |
| JP | 9-252095 A | 9/1997 |
| JP | 2002-064140 A | 2/2002 |
| JP | 2002-289810 A | 10/2002 |
| JP | 2003-229482 A | 8/2003 |
| JP | 2003-523624 A | 8/2003 |
| JP | 2005-217371 A | 8/2005 |
| JP | 2005-236285 A | 9/2005 |
| JP | 2006-245268 A | 9/2006 |
| JP | 2007-281114 A | 10/2007 |
| KR | 10-2008-0012996 A | 2/2008 |
| WO | 03/005438 A2 | 1/2003 |

OTHER PUBLICATIONS

International Search Report of PCT/JP2008/061023, mailing date Sep. 9, 2008.
Korean Office Action dated Jan. 4, 2012, issued in corresponding Korean Patent Application No. 10-2010-7025083, with English Translation.
Japanese Office Action dated Oct. 23, 2012, issued in corresponding Japanese patent application No. 2010-517581, w/ English translation.
Chinese Office Action dated Dec. 3, 2012, issued in corresponding Chinese Patent Application No. 200880129496.5.

* cited by examiner

*Primary Examiner* — Bradley K Smith
(74) *Attorney, Agent, or Firm* — Westerman, Hattori, Daniels & Adrian, LLP

(57) ABSTRACT

The method of manufacturing a semiconductor device includes forming an insulating film of a silicon compound-group insulation film; forming an opening in the insulation film, applying an active energy beam in an atmosphere containing hydrocarbon gas to form a barrier layer of a crystalline SiC, and forming an interconnection structure of copper in the opening with the barrier layer formed in.

12 Claims, 9 Drawing Sheets

SEMICONDUCTOR DEVICE AND METHOD OF MANUFACTURING SEMICONDUCTOR DEVICE

CROSS REFERENCE TO RELATED APPLICATIONS

This application is a Continuation of International Application No. PCT/JP2008/061023, with an international filing date of Jun. 17, 2008, which designating the United States of America, the entire contents of which are incorporated herein by reference.

FIELD

The embodiments discussed herein are related to a semiconductor device and method of manufacturing semiconductor device, more specifically, a semiconductor device including copper interconnection and manufacturing method thereof.

BACKGROUND

As the downsizing and high operability of semiconductor devices have been required, for forming interconnection layers of the recent semiconductor devices, the so-called damascene method, in which trench patterns and hole patterns are formed in an inter-layer insulating film, and an interconnection material is buried in the trenches and holes, is used. As the interconnection material, copper (Cu), which is less resistive than aluminum, is used in place of aluminum conventionally used.

Copper is a metal material which tends to diffuse into silicon oxide film which is the main material of the inter-layer insulating film. There is a risk that copper diffusing in the inter-layer insulating film will cause short circuits and defects of the interconnections. When copper is used as the interconnection material, it is preferable that a barrier layer for preventing the diffusion of the copper is provided on the inside walls of the trenches and holes to thereby prevent the diffusion of the copper into the inter-layer insulating film. Conventionally, as the barrier layer materials, barrier metal materials, such as titanium (Ti), tantalum (Ta), etc., have been used.

The following is a example of related: Japanese Laid-open Patent Publication No. 09-252095.

However, titanium and tantalum, which are the conventionally used barrier layer materials, have low oxidation resistance and are often oxidized by the heat generated by the thermal processing of backend process or the heating during the operation. The oxidation of the barrier layer causes a risk that the interconnection resistance would rise and increase the interconnection delay, and the yield and reliability would decrease. Processing techniques for suppressing the oxidation of the barrier layer, and barrier layer materials of high oxidation resistance are required. It is also important that the barrier layer for the copper interconnections can be formed at a low temperature which is applicable to the backend process.

SUMMARY

According to one aspect of an embodiment, there is provided a method of manufacturing a semiconductor device including forming an insulating film of a silicon compound-group material over a substrate, forming an opening in the insulating film, applying an active energy beam in an atmosphere containing hydrocarbon gas to the insulating film with the opening formed in to form a barrier layer of a crystalline SiC on at least an inside surface of the opening, and forming an interconnection structure of copper in the opening of the insulating film with the barrier layer formed in.

According to another aspect of an embodiment, there is provided a semiconductor device including an insulating film having an opening, a barrier layer of crystalline SiC formed on the inside surface of the opening of the insulating film, and an interconnection structure of copper formed in the opening with the barrier layer formed in.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

The semiconductor device and the method of manufacturing the same according to an embodiment will be described with reference to FIGS. 1 to 9.

Figure 1:
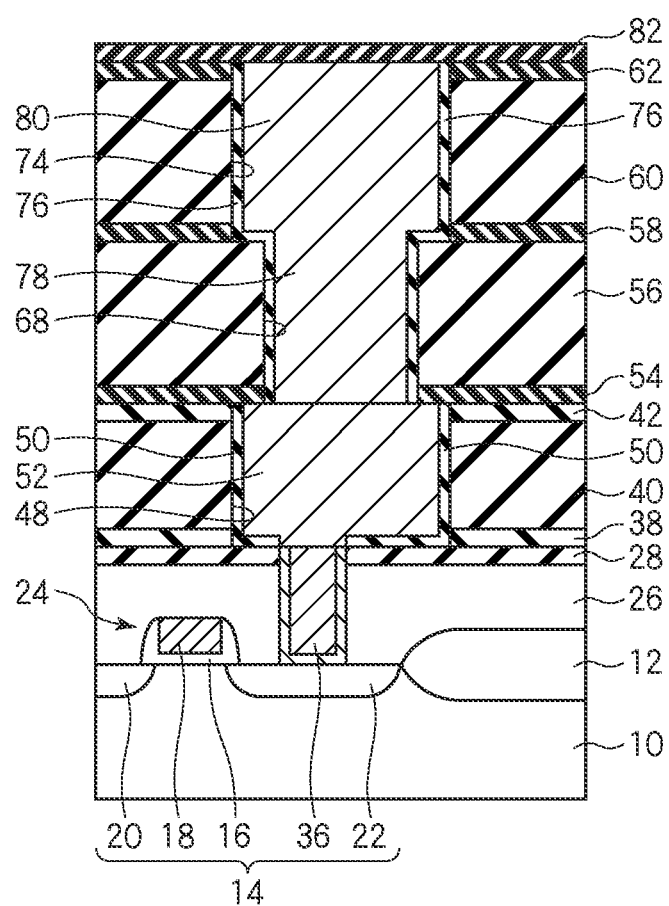
FIG. 1 is a diagrammatic cross-sectional view illustrating a structure of the semiconductor device according to an embodiment.

FIG. 1 is a diagrammatic cross-sectional view illustrating the structure of the semiconductor device according to the present embodiment. FIGS. 2A-9 are cross-sectional views illustrating the method of manufacturing the semiconductor device according to the present embodiment.

First, the structure of the semiconductor device according to the present embodiment will be described with reference to FIG. 1.

A device isolation film 12 for defining device regions 14 is formed on a silicon substrate 10. In the device region 14, a MIS transistor 14 including a gate electrode 18 formed over the silicon substrate 10 with a gate insulating film 16 interposed therebetween, and source/drain regions 20, 22 formed in the semiconductor substrate 10 on both sides of the gate electrode 18 is formed.

Over the silicon substrate 10 with the MIS transistors 24 formed on, an inter-layer insulating film 26 and a stopper film 28 are formed. In the inter-layer insulating film 26 and the stopper film 28, a contact plug 36 connected to the source/drain region 22 is buried.

Over the stopper film 28 with the contact plugs buried in, an insulating film 38, an inter-layer insulating film 40 and an insulating film 42 are formed. In the insulating film 38, the inter-layer insulating film 40 and the insulating film 42, an interconnection trench 48 is formed. On an inner surface of the interconnection trench 48 except that on the contact plug 36, a barrier layer 50 of a SiC film is formed. In the interconnection trench 18 with the barrier layer 50 formed in, an interconnection 52 of Cu film is buried in.

Over the insulating film 42 with the barrier layer 50 and the interconnection 52 buried in, an insulating film 54, an inter-layer insulating film 56, an insulating film 58, an inter-layer insulating film 60 and an insulating film 62 are formed. In the insulating film 54 and the inter-layer insulating film 56, a via-hole 68 reaching down to the interconnection 52 is formed. In the insulating film 58, the inter-layer insulating film 60 and the insulating film 62, an interconnection trench 74 connected to the via-hole 68 is formed. On the inner surface of the via-hole 68 and the interconnection trench 74 except that on the interconnection 52, a barrier layer 76 of a SiC film is formed. In the via-hole 68 with the barrier layer 76 formed in, a contact plug 78 of Cu film is buried in. In the interconnection trench 74 with the barrier layer 76 formed in, an interconnection 80 of Cu film is buried in. The contact plug 78 and the interconnection 80 are formed integral with each other.

Over the insulating film 62 with the interconnection 80 buried in, an insulating film 82 is formed.

As described above, in the semiconductor device according to the present embodiment, the barrier layer 50 of SiC film is formed on the inner surface of the interconnection trench for burying the interconnection 52, and on the inner surface of the via-hole 68 and interconnection trenches 74 with the contact plugs 78 and the interconnections 80 buried in, the barrier layer 76 of SiC film is formed.

SiC is a material of high barrier ability (diffusion prevention) to metal and is very effective as the barrier layer for preventing the diffusion of metal (Cu) of the interconnection material to the inter-layer insulating films. SiC is a material of high oxidation resistance and is never oxidized in the thermal processing for the backend processing, heating of operations, etc. SiC film is used as the barrier layers, whereby the barrier ability and oxidation resistance to metal can be improved, and the yield and reliability of the semiconductor device can be improved.

SiC used as the barrier layers is not especially limited, but in terms of the very high diffusion preventing effect due to dense crystal structure and very high oxidation resistance, crystalline α-SiC and β-SiC, especially β-SiC is preferable. β-SiC is called also 3C—SiC and has the crystal structure of the zincblende structure, which is a substituted structure of the diamond structure. The covalent bond of Si and C is very strong and stable and has the properties of heat resistance, high strength, high hardness and anticorrosion. β-SiC has good barrier ability to metal and good oxidation resistance and is suitable especially for the barrier layer material.

Usually, β-SiC is formed at a high temperature exceeding 600° C. and has not been able to be applied to the backend process for the semiconductor devices, whose processing is made at a temperature of below about 400° C. However, the method, which will be described later, makes it possible to form β-SiC film at a low temperature of about 50-250° C. and apply β-SiC film to the backend process.

Next the method of manufacturing the semiconductor device according to the present embodiment will be described with reference to FIGS. 2A to 9.

First, the device isolation film 12 for defining the device region 14 is formed in the semiconductor substrate 10 of, e.g., silicon by, e.g., LOCOS (LOCal Oxidation of Silicon) method. The device isolation film 12 may be formed by STI (Shallow Trench Isolation) method.

Figure 2A:
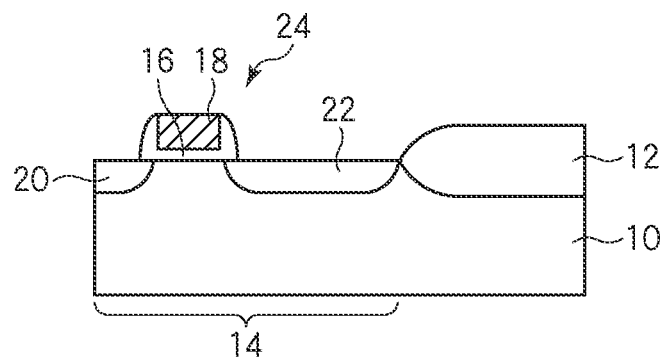
FIGS. 2A-2C, 3A-3B, 4A-4B, 5, 6, 7, 8 and 9 are cross-sectional views illustrating a method of manufacturing the semiconductor device according to the embodiment.
Figure 2B:
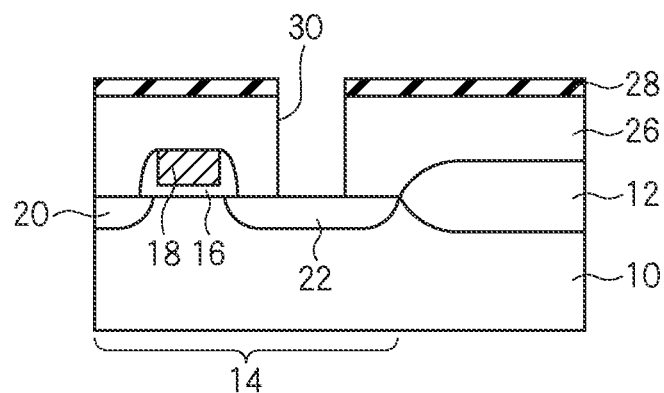

Next, in the same way as in the usual MOS transistor manufacturing method, MIS transistors 24 each including the gate electrode 18 formed over the semiconductor substrate 19 with the gate insulating film 16 interposed therebetween and the source/drain regions 20, 22 formed in the semiconductor substrate 10 on both sides of the gate electrode 18 is formed on the device regions 14 (FIG. 2A).

Next, over the semiconductor substrate 10 with the MIS transistor 24 formed on, a silicon oxide ($SiO_2$) film of, e.g., a 500 nm-thickness is deposited by, e.g., CVD method.

Next, the surface of the silicon oxide film is polished and planarized by, e.g., CMP (Chemical Mechanical Polishing) method, and the inter-layer insulating film 26 of the silicon oxide film having the surface planarized is formed.

Then, over the inter-layer insulating film 26, a silicon nitride (SiN) film of, e.g., a 50 nm-thickness is deposited by, e.g., plasma CVD method to form the stopper film 28 of silicon nitride film. The stopper film 28 functions, in the steps to be described below, as the polishing stopper for the polishing by CMP and as the etching stopper for forming the interconnection trench 46 in the inter-layer insulating film 38, etc. The stopper film 28 is formed of a material whose etching characteristics different from those of a film to be formed thereon and can be formed of, e.g., SiC:H film, SiC:O:H film, SiC:N film or others other than silicon nitride film can be used.

Then, by photolithography and dry etching, the contact hole 30 down to the source/drain region 22 is formed in the stopper film 28 and the inter-layer insulating film 26.

Next, by, e.g., sputtering method, a TiN film of, e.g., a 50 nm-thickness is formed over the entire surface to form an adhesion layer 32 of TiN film.

Next, over the adhesion layer 32, a tungsten (W) film 34 of, e.g., a 1 μm-thickness is formed by, e.g., CVD method.

Figure 2C:
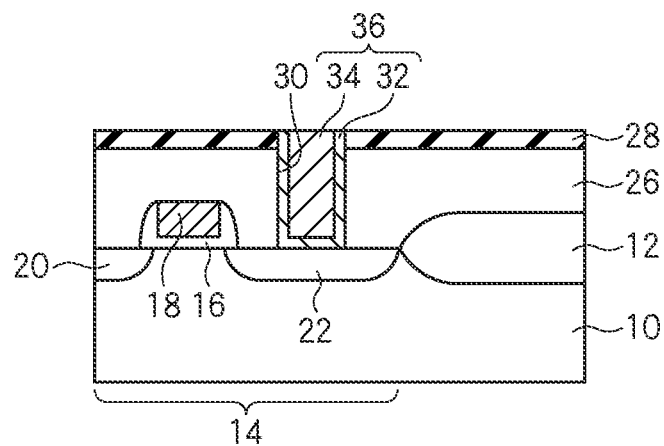

Next, the tungsten film 34 and the adhesion layer 32 are polished by, e.g., CMP method until the surface of the stopper film 28 is exposed to form the contact plug 36 of the adhesion layer 32 and the tungsten film 34 buried in the contact hole 30 (FIG. 2C).

Then, over the stopper film 28 with the contact plugs 36 buried in, an SiC:O:H film of, e.g., a 30 nm-thickness is deposited by, e.g., plasma CVD method to form the insulating film 38 of SiC:O:H film. SiC:O:H film is a film of high density having oxygen and hydrogen in SiC film and functions a the barrier film for preventing the diffusion of water, etc.

Then, over the insulating film 38, the inter-layer insulating film 40 of a porous silica material of, e.g., a 160 nm-thickness is formed.

In terms of reducing the interconnection delay, it is preferable to use as the inter-layer insulating film 40 a silicon compound-based insulating material of a low dielectric constant, e.g., a silicon compound-based insulating material containing at least a silicon polymer of the structure partially containing $CH_x$ (x is an integer of 0-2), Si—O—Si bond, Si—$CH_3$ bond and Si—$CH_x$ bond.

Such silicon compound-based insulating material can be a material given by subjecting to hydrolytic condensation reaction at least one selected out of the silicon compounds expressed by the following general formulas (1) to (3), and at least one selected out of the silicon compounds expressed by the following general formulas (4) to (7).

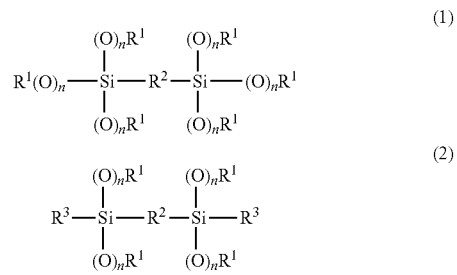

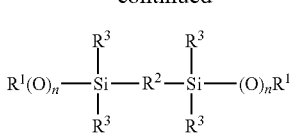

(3)

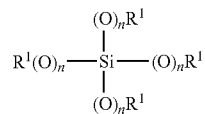

(4)

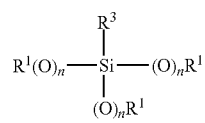

(5)

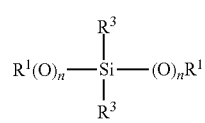

(6)

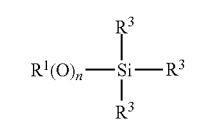

(7)

(where n represents 0 or 1; $R^1$ may be the same or different from each other, represents at least one of chlorine, bromine, fluorine and hydrogen when n=0, and represents one of hydrocarbon with a carbon number of 1-4, aromatic hydrocarbon, hydrogen and carboxyl group when n=1; $R^2$ represents one of hydrocarbon with a carbon number of 1-4, aromatic hydrocarbon and hydrogen; $R^3$ may be the same or different from each other, and represents hydrocarbon of a carbon number of 1-3 or aromatic hydrocarbon.)

The silicon compounds expressed by General formulas (1) to (7) are all materials called alkoxysilane. The materials of General formulas (1) to (3) have Si—R—Si bond, and the respective Si have 3 substituents. On the other hand, in the materials of General formulas (4) to (7), one Si has 4 substituents.

Porous silica is of the template type prepared by adding a pyrolytic resin or others to, e.g., organic SOG and cracking them by heating to form pores, and of the non-plate type prepared by forming silica particles in alkali and utilizing gaps between the particles to form pores. Between the types, the non-plate type, which can form uniform fine pores, is suitable.

The porous silica material of the non-plate type is represented by NCS series from JGC Catalysts and Chemicals Ltd., LKD series from JSR Corporation, etc.

As other thermal materials of the porous silica material, for example, liquid compounds containing organic silicon compound given by hydrolysis in the presence of tetraalkyl ammonium hydrooxide (TAAOH) is suitable. This material has an elastic modulus of not less than 10 GPa and a hardness of not less than 1 GPa, and can have a low dielectric constant and a high strength at once.

As the organic silicon compound, for example, tetraalkoxysilane, trialkoxysilane, methyltrialkoxysilane, ethyltrialkoxysilane, propyltrialkoxysilane, phenyltrialkoxysilane, vinyltrialkoxysilane, allyltrialkoxysilane, glycidyltrialkoxysilane, dialkoxysilane, dimethyldialkoxysilane, diethyldialkoxysilane, dipropyldialkoxysilane, diphenyldialkoxysilane, divinyldialkoxysilane, diallyldialkoxysilane, diglycidyldialkoxysilane, phenylmethyldialkoxysilane, phenylethyldialkoxysilane, phenylpropyltrialkoxysilane, phenylvinyldialkoxysilane, phenylallyldialkoxysilane, phenylglycidyldialkoxysilane, methylvinyldialkoxysilane, ethylvinyldialkoxysilane, propylvinyldialkoxysilane, or others can be used.

The coating solution to be used in forming the coating-type porous silica film is not especially limited as long as it can solve siloxane resin, which is the porous silica precursor, and the alcohol group, such as methyl alcohol, ethyl alcohol, propyl alcohol, isopropyl alcohol, butyl alcohol, isobutyl alcohol, tert-butyl alcohol, etc., the phenol group, such as phenol, cresol, diethylphenol, triethylphenol, propylphenol, nonylphenol, vinylphenol, allylphenol, nonylphenol, etc., the ketone group, such as cyclohexanone, methylisobutylketone, etc., the cellosolve group, such as methylcellosolve, ethylocellosolve, etc., the hydrocarbon group, such as hexane, octane, decane, etc., the glycol group, such as propylene glycol, propylene glycol monomethylether, propylene glycol monomethylether acetate, etc. can be used.

The insulating film of the coated insulating material can be formed by the step of coating the above-described insulating material to the base substrate, the step of heating the base substrate at 80° C.-350° C. and the step of curing the base substrate at 350° C.-450° C. The step of heating the substrate at 80° C.-350° C. and the step of curing the substrate at 350° C.-450° C. are made preferably in an inert gas atmosphere of an oxygen concentration of not more than 100 ppm. This is for preventing the moisture resistance of the insulating film decreasing due to oxidation.

Figure 3A:
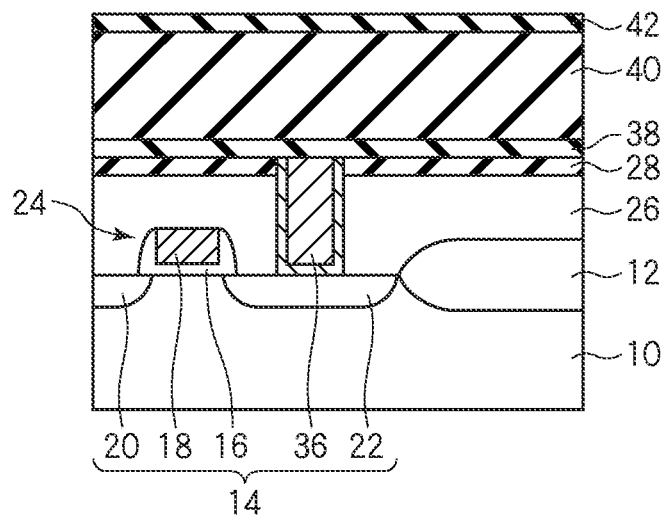

Then, over the inter-layer insulating film 40, a silicon oxide ($SiO_2$) film of, e.g., a 30 nm-thickness is deposited by, e.g., plasma CVD method to form the insulating film 42 of silicon oxide film (FIG. 3A).

Next, a photoresist film 44 with an opening 46 exposing the region for the first level interconnection 52 of a 100 nm-interconnection width and a 100 nm-space formed in is formed over the insulating film 40 by photolithography.

Figure 3B:
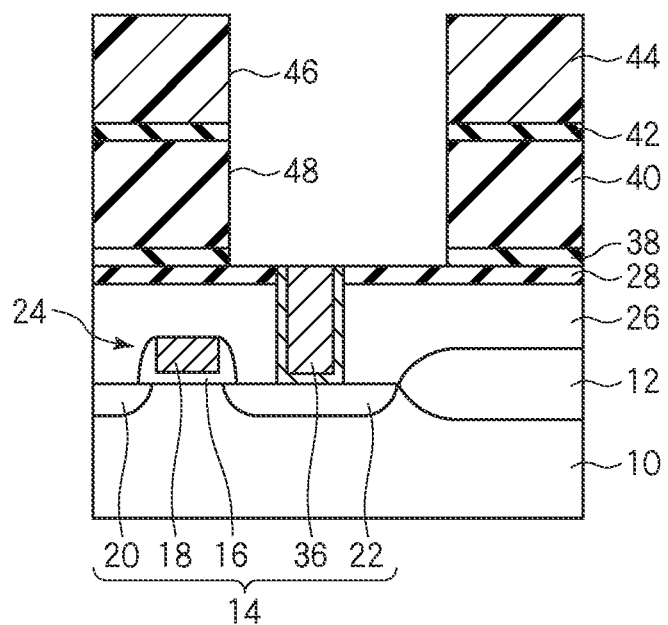

Then, by dry etching using, e.g., $CF_4$ gas and $CHF_3$ gas and with the photoresist film 46 as the mask and the stopper film 28 as the stopper, the insulating film 42, the inter-layer insulating film 40 and the insulating film 38 in the openings 46 are sequentially etched to form the interconnection trench 48 for the interconnection 52 to be buried in the insulating film 42, the inter-layer insulating film 40 and the insulating film 38 (FIG. 3B). By this etching, the upper surface of the contact plug 36 is exposed at the bottoms of the interconnection trench 48.

Next, by asking using, e.g., oxygen plasma, the photoresist film 42 is removed.

Figure 4A:
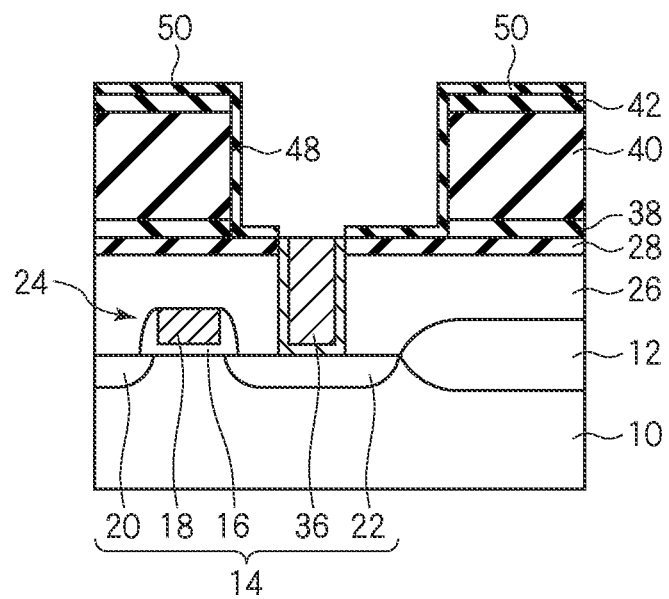

Then, in an atmosphere containing a hydrocarbon-group gas and with the substrate heated to 50° C.-250° C., active energy beam is applied. By this processing, the reaction between radicals of the hydrocarbon-group material decomposed by the active energy beam and the silicon compound-group insulating material is accelerated on the exposed surfaces of the stopper film 28, the insulating film 38, the inter-layer insulating film 40 and the insulating film 42 of the silicon compound-group insulation material, a crystalline SiC film is formed. Thus, the barrier layer 50 of crystalline SiC film is formed on the exposed surfaces of the stopper film 28, the insulating film 38, the inter-layer insulating film 40 and the insulating film 42 (FIG. 4A).

In the present embodiment, the barrier layer 50 is formed by reacting the hydrocarbon-based material and the silicon compound-group insulating film, the inter-layer insulating films (the stopper film 28, the insulating film 38, the inter-layer insulating film 40 and the insulating film 42) are formed of a silicon compound-group insulating material. The silicon compound-group insulating material is not especially limited but can be the above-described silicone polymer material, silicon oxide-group insulating materials, such as $SiO_2$, PSG, BPSG film, etc., SiN, SiON, SiC, SiOC, SiC:H, SiC:O:H, SiC:N, or others.

When the silicon compound-group insulating material containing at least silicone polymer partially having $CH_x$ (x is an integer of 0-2), Si—O—Si bond, Si—$CH_3$ bond and Si—$CH_x$ bond described above is used, radicals of hydrocarbon-group material are generated also from the silicon compound-group insulating material by the application of the active energy beam, which further accelerates the reaction between the hydrocarbon material and the silicon compound-group insulating material.

The hydrocarbon gas used in forming the barrier layer 50 is not especially limited as long as it is a hydrocarbon-group material, but methane, ethane, propane, butane, ethylene, propylene, butylene, acetylene, etc. can be used singly or in combination of plural ones of them. In terms of densely forming Si—C—Si bonds to form the barrier layer 50 dense, preferably the molecular weight is not so large, and methane and ethane are suitable.

As the active energy beam, electron beam, ultraviolet ray and plasma can be used singly or in combination of plural ones of them. The active energy beam is for activating the hydrocarbon-group gas and is selected suitably in accordance with an absorption band of the hydrocarbon-group gas. When methane, for example, whose absorption band is not more than 250 nm is used as the hydrocarbon-group gas, electron beam, a UV high-pressure mercury lamp, an excimer UV lamp, radiation of hydrogen plasma or others can be used.

The film thickness of the barrier layer 50 is 1-20 nm, preferably 2-20 nm. When the barrier layer 50 is formed in a thickness of less than 1 nm, the barrier ability is insufficient, and when the barrier layer 50 is formed in a film thickness of more than 20 nm, the interconnection resistance increase due to the volume decrease becomes conspicuous.

The SiC film to be formed is not especially limited, but in terms of the dense crystal structure, and very high diffusion prevention effect and oxidation resistance, crystalline α-SiC and β-SiC, especially β-SiC is preferable. β-SiC is called also 3C—SiC and has the zincblende structure, which is a substituted structure of the diamond structure. The covalent bond of Si and C is very strong and stable has good properties of heat resistance, high strength, high hardness, anticorrosion, etc. β-SiC has good barrier ability (diffusion preventiveness) to metal and oxidation resistance and is suitable as the barrier layer material.

When methane is used as the hydrocarbon-group gas, processing is made, e.g., for 30 minutes at 250° C. substrate temperature, 10 Pa processing chamber pressure and 2.5 keV acceleration voltage of electron beam, whereby β-SiC film of a 10 nm-thickness can be formed. The film thickness of the β-SiC film can be controlled by the processing period of time, etc.

Ordinarily, β-SiC film can be formed at a high temperature exceeding 600° C. and have been inapplicable to the backend process for semiconductor devices, which requires processing of not more than about 400° C. However, in the processing of the present embodiment, where the active energy beam applied in the hydrocarbon-group atmosphere, the radical copolymerization is accelerated by the active energy beam for the crystallization, which permits the β-SiC film to be formed at a low temperature of 50° C.-250° C. Thus, the processing of the present embodiment permits the barrier layer 50 of β-SiC to be applied to the backend process.

Then, a Cu film of, e.g., a 10 nm-thickness is deposited over the entire surface by, e.g., sputtering method to form a seed film (not illustrated) of Cu film.

Next, by, e.g., electroplating method, Cu film is deposited with the seed film as the seed, and a Cu film of, e.g., a 600 nm-total film thickness including the film thickness of the seed film is formed.

Figure 4B:
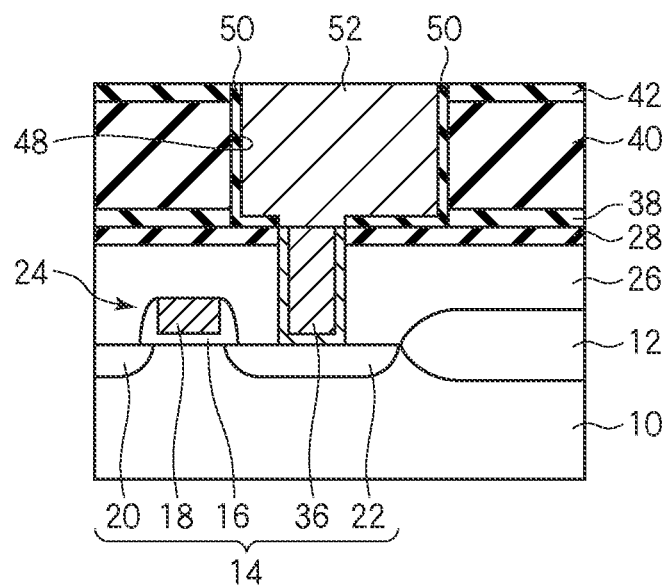

Then, the Cu film and the barrier layer 50 over the insulating film 42 is polished off by CMP method to form the interconnection 52 of Cu film buried in the interconnection trench 48 (FIG. 4B). Such forming process for the interconnection 52 is called single damascene process. In the present embodiment, the barrier layer 50 over the insulating film 42 is removed together with the Cu film, but the barrier layer 50, which is an insulating film, may be left over the insulating film 42.

Next, an SiC:O:H film of, e.g., a 30 nm-thickness is deposited over the entire surface by, e.g., CVD method to form the insulating film 54 of SiC:O:H film. The insulating film 54 functions as the barrier layer for preventing the diffusion of water and the diffusion of Cu from the Cu interconnection.

Next, the inter-layer insulating film 56 of a porous silica material is formed over the insulating film 54. The process for forming the inter-layer insulating film 56 of a porous silica material can be, e.g., the same as the above-described process for forming the inter-layer insulating film 40. The film thickness of the inter-layer insulating film 56 is, e.g. 180 nm.

Next, an $SiO_2$ (silicon oxide) film of, e.g., a nm-thickness is deposited over the inter-layer insulating film 56 by, e.g., plasma CVD method to form the insulating film 58 of $SiO_2$ film.

Next, the inter-layer insulating film 60 of a porous silica material is formed over the insulating film 58. The process for forming the inter-layer insulating film 60 of a porous silica material can be, e.g., the same as the above-described process for forming the inter-layer insulating film 40. The film thickness of the inter-layer insulating film 60 is, e.g., 160 nm.

Figure 5:
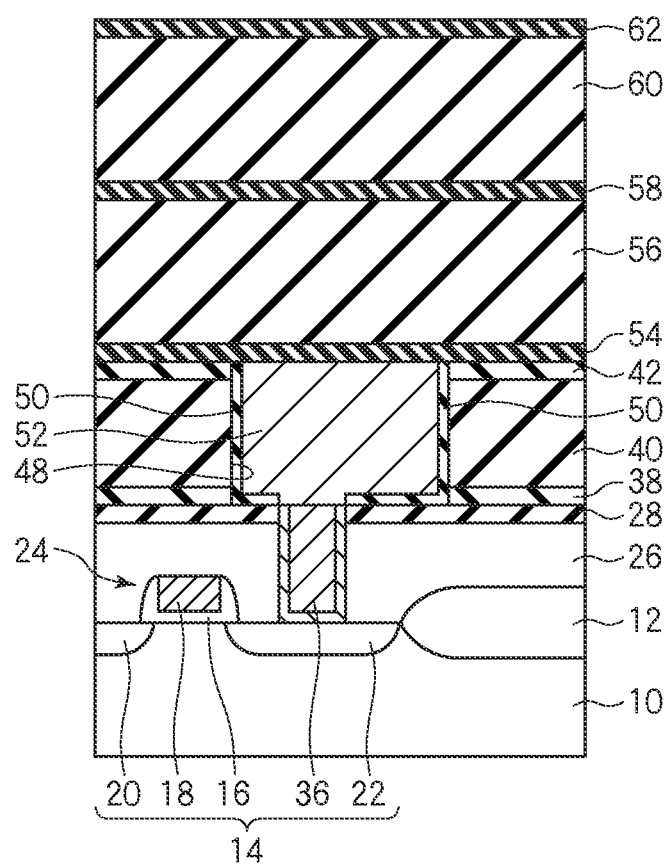

Next, an $SiO_2$ (silicon oxide) film of, e.g., a nm-thickness is deposited over the inter-layer insulating film 60 by, e.g., plasma CVD method to form the insulating film 62 of $SiO_2$ film (FIG. 5).

Next, a photoresist film 64 having an opening 66 for exposing the region where the via hole 68 arriving at the interconnection 52 is to be formed is formed over the insulating film 62 by photolithography.

Figure 6:
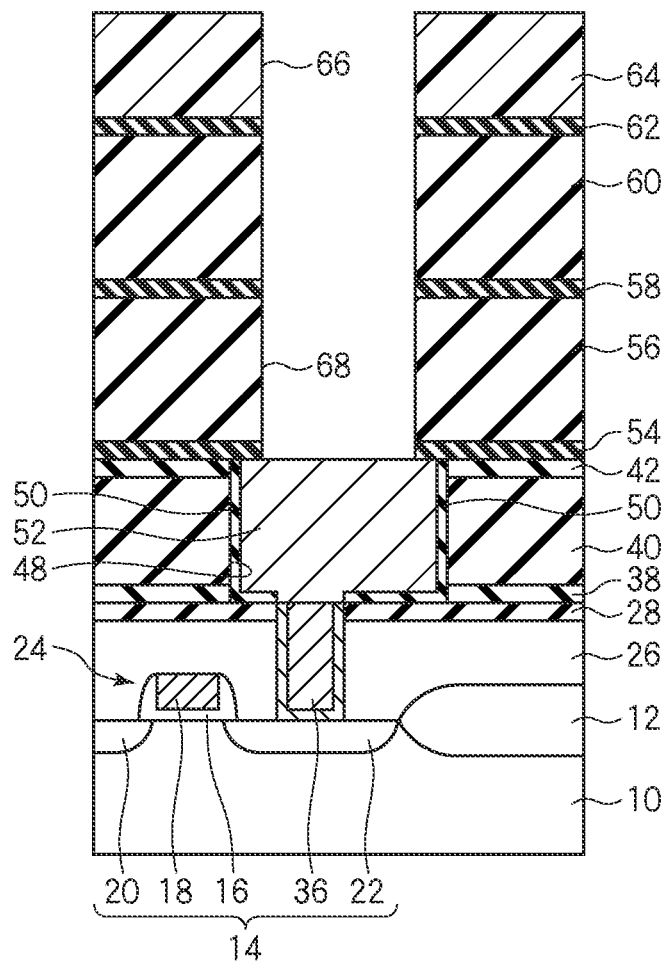

Then, by dry etching with, e.g., $CF_4$ gas and $CHF_3$ gas and with the photoresist film 64 as the mask, the insulating film 62, the inter-layer insulating film 60, the insulating film 58, the inter-layer insulating film and the insulating film 54 in the opening 66 are sequentially etched to form the via hole 68 down the interconnection 52 in the inter-layer insulating film 60, the insulating film 58, the inter-layer insulating film 56 and the insulating film 54 (FIG. 6). The respective insulating films can be sequentially etched by suitably changing the etching gas composition ratio, and the pressure, etc. for the etching.

Then, the photoresist film 64 is removed by, e.g., ashing. In the dry etching for forming the via hole 68, when a sidewall deposit on the inside walls of the via hole 68, the sidewall deposit can be concurrently removed in this ashing step.

Next, a photoresist film 70 having an opening 72 for exposing the region where the second level interconnection 80 is to be formed is formed by photolithography over the insulating film 62 with the via hole 68 opened.

Figure 7:
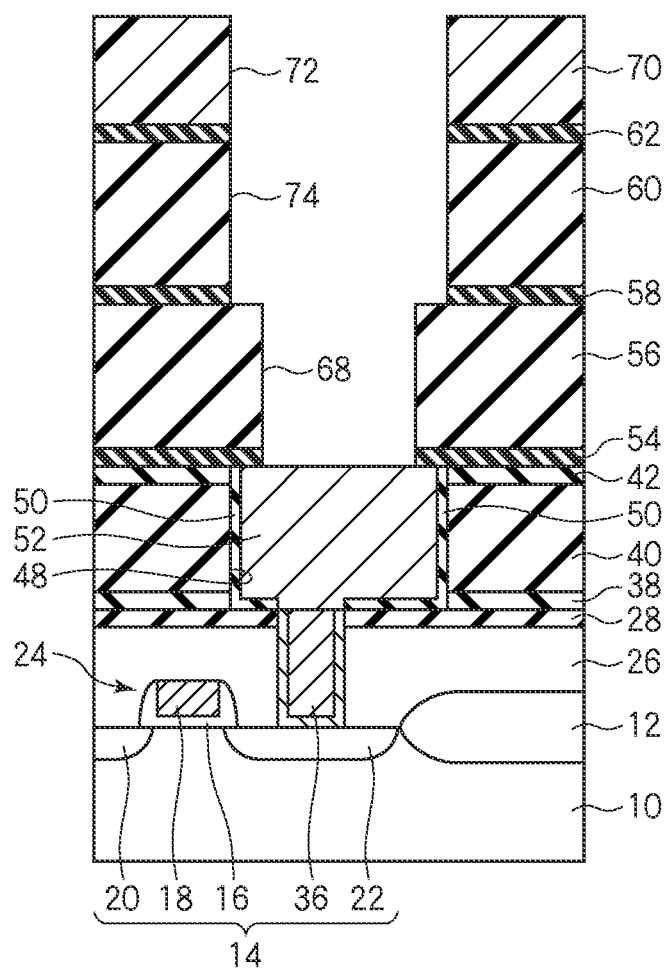

Next, by dry etching with, e.g., CF$_4$ gas and CHF$_3$ gas and with the photoresist film 70 as the mask, the insulating film 62, the inter-layer insulating film 60 and the insulating film 58 in the opening 72 are sequentially etched to form in the insulating film 62, the inter-layer insulating film 60 and the insulating film 58 the interconnection trench 72 for the interconnection 80 to be buried in (FIG. 7). The interconnection trench 74 is brought into contact with the via hole 68.

Then, the photoresist film 70 is removed by, e.g., ashing. In the dry etching for forming the interconnection trench 74, when a sidewall deposit is formed on the inside walls of the interconnection trenches 74, the sidewall deposit can be concurrently removed in this asking step.

Figure 8:
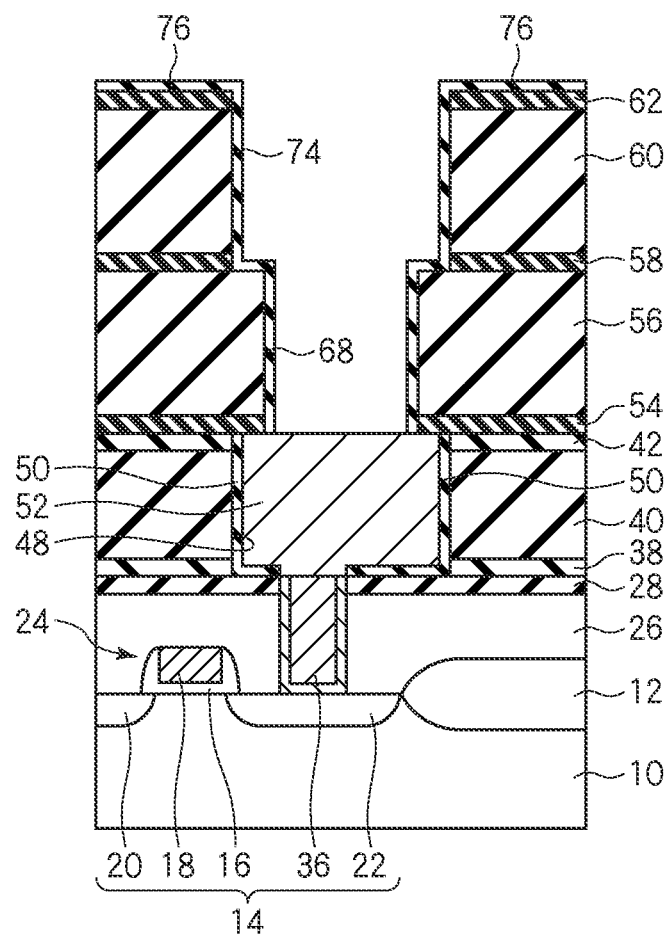

Then, in the same way as in forming the barrier layer 50, active energy beam is applied in an atmosphere containing hydrocarbon-group gas and with the substrate heated to 50° C.-250° C. to form the barrier layer 76 of SiC film over the exposed surfaces of the insulating film 54, the inter-layer insulating film 56, the insulating film 58, the inter-layer insulating film 60 and the insulating film 62 of silicon compound-group insulating materials (FIG. 8). The conditions for forming the barrier layer 76 may be the same as those for forming the above-described barrier layer 50.

In the present embodiment, a hydrocarbon-group material and a silicon compound-group material are reacted with each other to form the barrier layer 76, the inter-layer insulating films (the insulating film 54, the inter-layer insulating film 56, the insulating film 58, the inter-layer insulating film 60 and the insulating film 62) are formed of a silicon compound-group material. The silicon compound-group material is not especially limited but can be the above-described silicone polymer material, silicon oxide-group insulating material, such as SiO$_2$, PSG, BPSG, etc., SiN, SiON, SiC, SiOC, SiC:H, SiC:O:H, SiC:N, or others.

The SiC film to be formed is not especially limited, but in terms of the dense crystal structure, and the very high diffusion preventiveness and oxidation resistance, crystalline α-SiC and β-SiC, especially β-SiC is preferable. β-SiC has good barrier ability (diffusion preventiveness) to metal and oxidation resistance and is suitable as the barrier layer material.

In this process, heat processing of a high temperature exceeding 400° C. cannot be made because of the interconnection 52 of Cu which has been already formed below. However, the process of the present embodiment where active energy beam is applied in a hydrocarbon-group gas atmosphere, β-SiC film can be formed at a low temperature of about 50° C.-250° C. Thus, the processing of the present embodiment permits the barrier layer 76 of β-SiC film to be applied to the backend process.

Then, a Cu film of, e.g., a 10 nm-thickness is deposited over the entire surface by, e.g, sputtering method to form a seed film (not illustrated) of Cu film.

Next, a Cu film is deposited by, e.g., electroplating method with the seed film as the seed to form a Cu film of, e.g., a total film thickness of 1400 nm including the film thickness of the seed layer.

Then, the Cu film and the barrier layer 76 over the insulating film 62 are polished off by CMP method to form the contact plug 78 of Cu film buried in the via hole 68, and the interconnection 80 of the Cu film buried in the interconnection trench 72 integral with each other and at once. Such processing for forming the contact plug and the interconnection 78 at once is called dual damascene process. In the present embodiment, the barrier layer 76 over the insulating film 62 is removed together with the Cu film, but the barrier layer 76, which is an insulating film, may be left over the insulating film 22.

Figure 9:
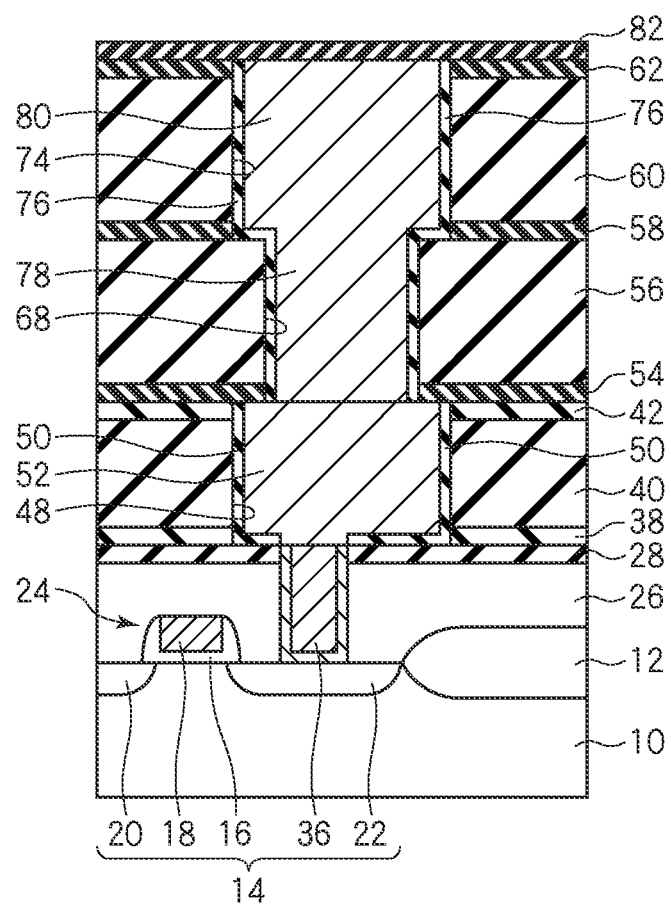

Then, an SiC:O:H film of, e.g., a 30 nm-thickness is deposited over the entire surface by, e.g., CVD method to form the insulating film 82 of SiC:O:H film (FIG. 9). The insulating film 82 functions as the barrier layer for preventing the diffusion of water, and the diffusion of Cu from the Cu interconnections.

Hereafter, the above-described steps are repeated as required to form the third level interconnection and others (not illustrated), and the semiconductor device according to the present embodiment is completed.

To test the effect of the present embodiment, based on the above-described manufacturing process, six samples described below were prepared, and their characteristics were evaluated.

Example 1

By the above-described manufacturing process, the semiconductor device including a 5 nm-thickness β-SiC as the barrier layers 50, 76 was manufactured.

Example 2

By the above-described manufacturing process, the semiconductor device including a 10 nm-thickness β-SiC as the barrier layers 50, 76 was manufactured.

Example 3

By the above-described manufacturing process, the semiconductor device including a 20 nm-thickness β-SiC as the barrier layers 50, 76 was manufactured.

[Control 1]

The semiconductor device was manufactured by the above-described manufacturing process except that a 20 nm-thickness Ti barrier metal was formed in place of the barrier layers 50, 76.

[Control 2]

The semiconductor device was manufactured by the above-described manufacturing process except that a 20 nm-thickness Ta barrier metal was formed in place of the barrier layers 50, 76.

[Control 3]

The semiconductor device was manufactured by the above-described manufacturing process except that a 20 nm-thickness Ti/Ta layer film barrier metal was formed in place of the barrier layers 50, 76.

The interconnection yield and the interconnection resistance after a high temperature storage test were evaluated on the respective samples thus formed. The evaluation of the interconnection yield was made by using an evaluation element having interconnections and contact plugs for electrically serially connecting 1,000,000 contacts. The evaluation of the interconnection resistance after the high temperature storage test was made by measuring increase rates of the interconnection resistances after the samples were left for 168 hours and 504 hours at 200° C. The results of the characteristics evaluation of the respective samples are shown.

TABLE 1

|  | Film | | Interconnection Resistance Increase [%] | |
|---|---|---|---|---|
| Barrier Layer | Thickness [nm] | Yield [%] | After 168 Hours | After 504 Hours |
| Example 1 β-SiC | 5 | 96.1 | 4.1 | 4.5 |
| Example 2 β-SiC | 10 | 100 | 3.2 | 3.6 |
| Example 3 β-SiC | 20 | 96.1 | 3.8 | 4.3 |
| Control 1 Ti | 20 | 57.6 | 14.7 | 27.4 |
| Control 2 Ta | 20 | 51.1 | 37.6 | 46.2 |
| Control 3 Ti/Ta | 20 | 57.6 | 12.3 | 26.3 |

As shown in Table 1, in Example 1-3, whose barrier layers 50, 76 are formed of β-SiC, the interconnection yield is 96.1%-100%, while in Controls 1-3, whose barrier layers 50, 76 are formed of the metal materials, the interconnection yield is 52.1%-57.60. A large significant difference is present.

As for the interconnection resistance after the 200° C. high temperature storage test, the increase rates of the samples of Examples 1-3, whose barrier layers 50, 76 were formed of β-SiC is drastically smaller than the increase rates of the samples of Controls 1-3, whose barrier layers 50, 76 were formed of the metal materials. As for the changes of the increase rate of the interconnection resistance after 168 hours storage and 504 hours storage, the sample of Examples 1-3, whose barrier layers 50, 76 were formed of β-SiC, had drastically smaller in comparison with those of the samples of Control 1-3, whose barrier layers 50, 76 were formed of the metal materials.

Based on these results, it has been confirmed that β-SiC has good characteristics as the barrier layer material.

As described above, according to the present embodiment, the barrier layers for preventing the diffusion of copper from the interconnection structure is formed of SiC, whereby the copper diffusion barrier ability of the barrier layers can be ensured, and also the oxidation resistance of the barrier layers can be improved.

The barrier layer of crystalline SiC is formed by applying active energy beam in a hydrocarbon-group gas atmosphere, which permits the heating temperature for this to be lowered down to about 50° C.-250° C. Thus, this processing can be applied to the backend process of semiconductor devices, in which thermal processing of not more than 400° C. cannot be made.

Modified Embodiments

The above-described embodiment can cover other various modifications.

The present embodiment is not limited to the structure of the semiconductor device and its manufacturing method described above and is widely applicable to semiconductor devices including insulating films of silicon compound-group insulating materials and copper interconnections buried in the insulating films, and their manufacturing methods. The film thickness, the constituent material, etc. of the respective layers forming the semiconductor device can be also changed in their scope.

The present invention is applicable not only to semiconductor devices, but also to interconnection substrates (e.g., circuit boards) including insulating films of silicon compound-group materials, and copper interconnections buried in the insulating films.

In this specification, the substrate is a semiconductor substrate itself, such as a silicon substrate or others and includes also semiconductor substrates with elements, such as MIS transistors, etc., and one layer or plural layers of interconnections formed on. The interconnection structure includes the contact plugs and the interconnections described in the above-described embodiment and also includes conductive patterns formed concurrently therewith, e.g., dummy patterns for CMP, moisture resistance rings, etc.

What is claimed is:

1. A method of manufacturing a semiconductor device comprising:
   forming an insulating film of a silicon compound-group material over a substrate;
   forming an opening in the insulating film;
   applying an active energy beam in an atmosphere containing hydrocarbon gas to the insulating film with the opening formed in to form a barrier layer of a crystalline SiC on at least an inside surface of the opening; and
   forming an interconnection structure of copper in the opening of the insulating film with the barrier layer formed in, wherein
   in forming the barrier layer, the barrier layer of β-SiC is formed.

2. The method of manufacturing a semiconductor device according to claim 1, wherein
   in forming the insulating film, the insulating film including a film formed of a silicone polymer containing $CH_x$ (x is an integer of 0-2), Si—O—Si bond, Si—$CH_3$ bond and Si—$CH_x$ bond (x is an integer of 0-2) is formed.

3. The method of manufacturing a semiconductor device according to claim 2, wherein
   the film of the silicone polymer is a porous film.

4. The method of manufacturing a semiconductor device according to claim 1, wherein
   the active energy beam is an electron beam, an ultraviolet ray, or a radiation emitted from plasma.

5. The method of manufacturing a semiconductor device according to claim 1, wherein
   the hydrocarbon-group gas contains at least one kind of gas selected from the group consisting of: methane, ethane, propane, butane, ethylene, propylene, butylene and acetylene.

6. The method of manufacturing a semiconductor device according to claim 1, wherein
   in forming the opening, the opening having a via hole formed in a lower part of the insulating film, and an interconnection trench formed in an upper part of the insulating film in connection with the via hole is formed.

7. A method of manufacturing a semiconductor device comprising:
   forming an insulating film of a silicon compound-group material over a substrate;
   forming an opening in the insulating film;
   applying an active energy beam in an atmosphere containing hydrocarbon gas to the insulating film with the opening formed in to form a barrier layer of a crystalline SiC on at least an inside surface of the opening; and
   forming an interconnection structure of copper in the opening of the insulating film with the barrier layer formed in, wherein
   in forming the barrier layer, the active energy beam is applied with the substrate heated to 50° C.-250° C.

8. The method of manufacturing a semiconductor device according to claim 7, wherein
   in forming the insulating film, the insulating film including a film formed of a silicone polymer containing $CH_x$ (x is an integer of 0-2), Si—O—Si bond, Si—$CH_3$ bond and Si—$CH_x$ bond (x is an integer of 0-2) is formed.

9. The method of manufacturing a semiconductor device according to claim 8, wherein
the film of the silicone polymer is a porous film.

10. The method of manufacturing a semiconductor device according to claim 7, wherein
the active energy beam is an electron beam, an ultraviolet ray, or a radiation emitted from plasma.

11. The method of manufacturing a semiconductor device according to claim 7, wherein
the hydrocarbon-group gas contains at least one kind of gas selected from the group consisting of: methane, ethane, propane, butane, ethylene, propylene, butylene and acetylene.

12. The method of manufacturing a semiconductor device according to claim 7, wherein
in forming the opening, the opening having a via hole formed in a lower part of the insulating film, and an interconnection trench formed in an upper part of the insulating film in connection with the via hole is formed.

\* \* \* \* \*